(12) United States Patent
Munguia et al.

(10) Patent No.: US 7,023,745 B2
(45) Date of Patent: Apr. 4, 2006

(54) VOLTAGE DETECT MECHANISM

(75) Inventors: Peter R. Munguia, Chandler, AZ (US); Edward Butler, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/747,390

(22) Filed: Dec. 29, 2003

(65) Prior Publication Data

US 2005/0146949 A1    Jul. 7, 2005

(51) Int. Cl.
*G11C 7/00*    (2006.01)

(52) U.S. Cl. .................... 365/189.11; 365/196
(58) Field of Classification Search ........... 365/185.28, 365/185.24, 189.11, 196
See application file for complete search history.

(56) References Cited

U.S. PATENT DOCUMENTS

| | | | |
|---|---|---|---|
| 6,166,960 A * | 12/2000 | Marneweck et al. ... | 365/185.28 |
| 6,184,724 B1 * | 2/2001 | Lin .............................. | 327/80 |
| 6,515,901 B1 * | 2/2003 | Underwood ........... | 365/185.18 |
| 6,524,887 B1 * | 2/2003 | Li et al. ..................... | 438/106 |
| 6,538,517 B1 * | 3/2003 | Lu .............................. | 331/17 |
| 6,597,605 B1 * | 7/2003 | Kreifels et al. ........ | 365/185.28 |
| 6,832,173 B1 * | 12/2004 | Starr et al. ................... | 702/106 |
| 6,891,411 B1 * | 5/2005 | Lever ........................ | 327/148 |

\* cited by examiner

*Primary Examiner*—M. Tran
(74) *Attorney, Agent, or Firm*—Blakely, Sokoloff, Taylor & Zafman LLP

(57) ABSTRACT

According to one embodiment a computer system is disclosed. The computer system includes a central processing unit (CPU) and a memory device, coupled to the CPU. The memory device includes a charge pump circuit to amplify a first voltage, and a voltage detection circuit coupled to the charge pump circuit to disable the charge pump circuit if a second voltage is detected.

25 Claims, 3 Drawing Sheets

VOLTAGE DETECT MECHANISM

FIELD OF THE INVENTION

The present invention relates to computer systems; more particularly, the present invention relates to memory devices.

BACKGROUND

Products such as mobile computers, handheld appliances, personal assistants, and cell phones, etc., demand internal components that have low power consumption to preserve battery life, thus insuring longer operating times. Systems requiring high performance, such as desktops and servers are power conscious and more sensitive to high thermal environments. Semiconductors used in these applications that rely on internal voltage generators, such as charge pump systems, are inefficient in terms of power conservation. A typical charge pump system has a voltage generation efficiency rating of ~25% to 30%. This inefficiency consumes excess power and contributes both to reduced battery life and increased thermal environments.

Semiconductor products such as a Dynamic Random Access Memory (DRAM), Flash, and Systems on Chip that utilize such memories typically generate internal operating voltages for the memory array. Charge pumps generate these voltages and are used to reduce component external input voltage pin count, which reduces cost. This voltage is higher and/or lower than that supplied via system power supplies or regulators through standard voltage input pins. These voltages are typically generated with an internal charge pump system(s) that increases or decreases the nominal input voltage value.

BRIEF DESCRIPTION OF THE DRAWINGS

The present invention will be understood more fully from the detailed description given below and from the accompanying drawings of various embodiments of the invention. The drawings, however, should not be taken to limit the invention to the specific embodiments, but are for explanation and understanding only.

DETAILED DESCRIPTION

A voltage detect mechanism is described. According to one embodiment, an external voltage supplied by a voltage rail is detected via auto detect circuitry, which includes standard transistor devices found in typical semiconductor manufacturing processes. If a voltage suitable to support a memory array is detected, a charge pump is disabled and bypassed. Also a regulator is enabled to supply the proper control logic voltage. The control logic requires a standard operating voltage to function. If the external voltage is standard, the charge pump is enabled to supply the proper memory array voltage and the regulator is disabled allowing for the standard voltage to supply the control logic.

In the following description, numerous details are set forth. It will be apparent, however, to one skilled in the art, that the present invention may be practiced without these specific details. In other instances, well-known structures and devices are shown in block diagram form, rather than in detail, in order to avoid obscuring the present invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Figure 1:
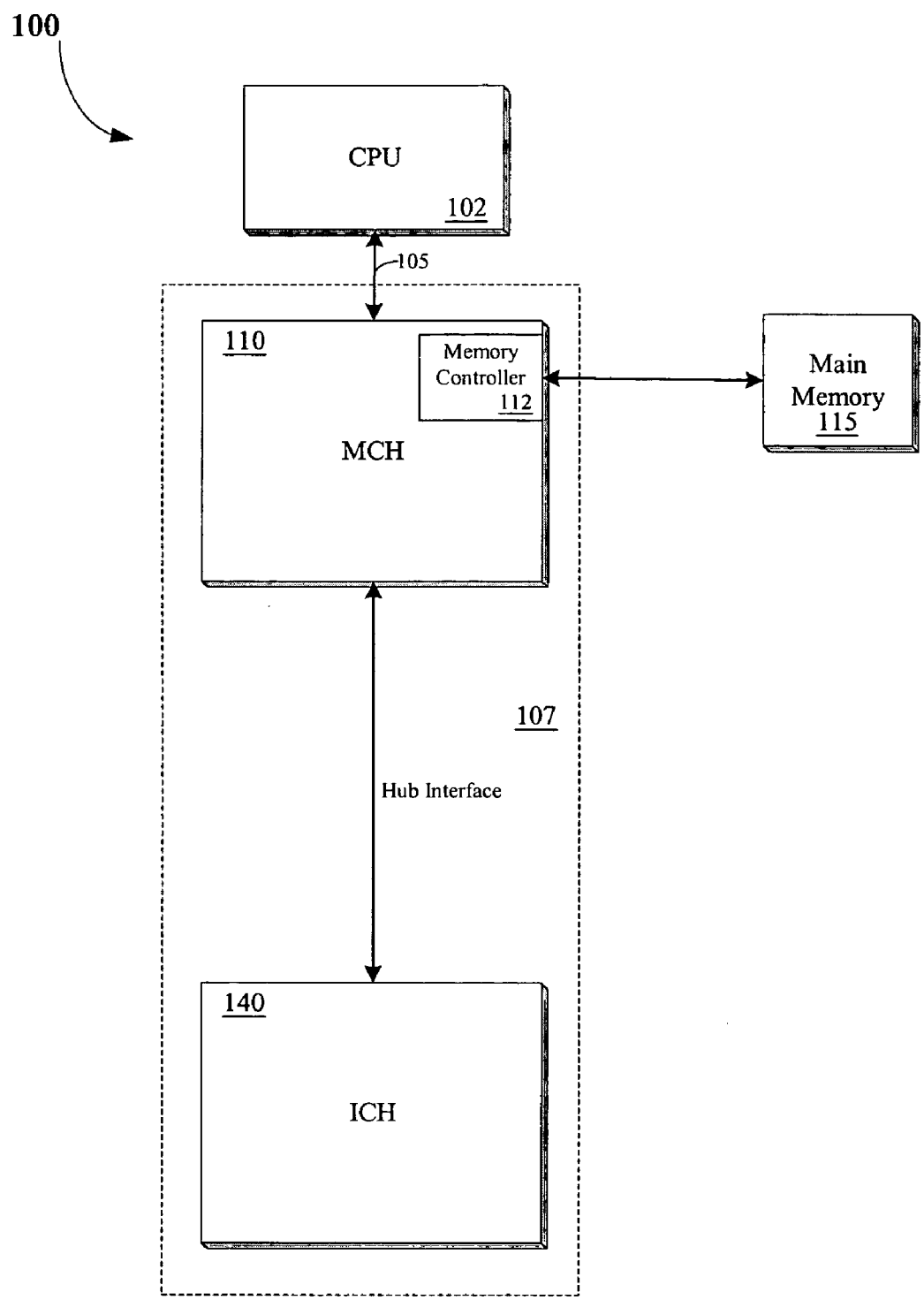
FIG. 1 illustrates one embodiment of a computer system.

FIG. 1 is a block diagram of one embodiment of a computer system 100. Computer system 100 includes a central processing unit (CPU) 102 coupled to bus 105. In one embodiment, CPU 102 is a processor in the Pentium® family of processors including the Pentium® II processor family, Pentium® III processors, and Pentium® IV processors available from Intel Corporation of Santa Clara, Calif. Alternatively, other CPUs may be used.

A chipset 107 is also coupled to bus 105. Chipset 107 includes a memory control hub (MCH) 110. In one embodiment, MCH 110 is coupled to an input/output control hub (ICH) 140 via a hub interface. ICH 140 provides an interface to input/output (I/O) devices within computer system 100. For instance, ICH 140 may be coupled to a Peripheral Component Interconnect bus adhering to a Specification Revision 2.1 bus developed by the PCI Special Interest Group of Portland, Oreg.

In one embodiment, MCH 110 includes a memory controller 112 that is coupled to a main system memory 115. Main system memory 115 stores data and sequences of instructions and code represented by data signals that may be executed by CPU 102 or any other device included in system 100. In one embodiment, main system memory 115 includes dynamic random access memory (DRAM); however, main system memory 115 may be implemented using other memory types.

Memory devices, such as main system memory 115, typically implement charge pump circuitry to boost a voltage (e.g., 2.5V) source supplied by a motherboard to a voltage (e.g., 3.5V) suitable to operate a particular memory device. Typically, the voltage generated by the charge pump is available on the motherboard. However, the motherboard 3.5V voltage is not used so that external package pins may be conserved, hence enabling the reduction of costs and the ability to meet industry package standards. A problem with using charge pumps is that the charge pumps consume a relatively large magnitude of power.

According to one embodiment, a memory device is disclosed that modulates the internal memory device voltage to meet package pin standards. Consequently, charge pumps are used to step up lower voltages provided by the motherboard into voltages suitable for memory operation, or an external rail voltage may be supplied directly to a memory device.

Figure 2:
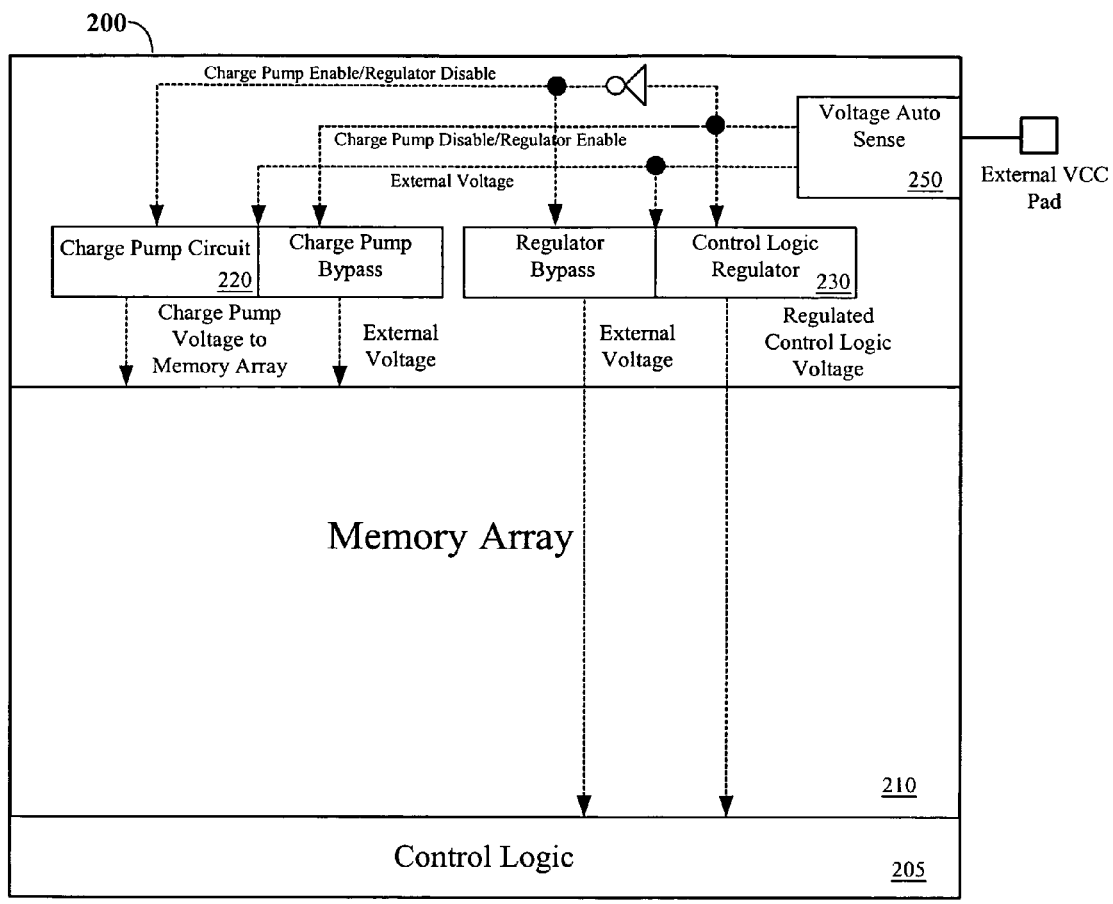
FIG. 2 illustrates one embodiment of a memory device.

FIG. 2 illustrates one embodiment of a memory device 200. Memory device 200 includes control logic 205, memory array 210, charge pump circuit 220, control logic regulator 230 and voltage auto sense circuit 250. Although described with respect to a DRAM embodiment, one of ordinary skill in the art will appreciate that other types of memory devices may be implemented for memory device 200.

Control logic 205 controls the operation of memory device 200. Particularly, control logic 205 manages the reading and writing of data from/to memory array 210. Memory array 220 is an array of storage locations used to store data for computer system 100. Charge pump circuit 220 is implemented to boost a low voltage power supply to (e.g., 1.5V) a higher voltage (e.g., 2.5V) suitable to drive array 220. According to one embodiment, charge pump 220 is coupled to power source supplied by a printed circuit board (not shown) to which memory device 200 is attached. Charge pump 220 supplies the boosted voltage to memory array 210.

Control logic regulator 230 regulates the control logic 205 to a proper operating voltage whenever charge pump circuit 220 is disabled. Voltage auto sense circuit 250 is coupled to memory array 210, charge pump circuit 220 and control logic regulator 230. Voltage auto sense circuit 250 detects whether memory device 200 is coupled to an external voltage rail capable of providing the proper memory array voltage.

In one embodiment, memory device 200 includes an external pad to receive the voltage rail. In a further embodiment, auto sense circuit 250 transmits a high logic level (e.g., logic 1) whenever an external voltage is detected at the external pad that is suitable to power array 210. Also, control logic regulator 230 is activated to regulate the higher array voltage level down to a standard operating voltage for the control logic 205 to function at specification, and the bypass component of charge pump circuit 220 is activated. Consequently, the external voltage is supplied to memory array 210

However, whenever auto sense circuit 250 detects a standard operating voltage a low logic level (e.g., logic 0) is transmitted, resulting in the charge pump circuit 220 being activated, and the bypass component of control logic regulator 230 being activated. Accordingly, the external voltage is supplied to control logic 205 and a boosted voltage from charge pump circuit 220 is supplied to memory array 210.

Figure 3:
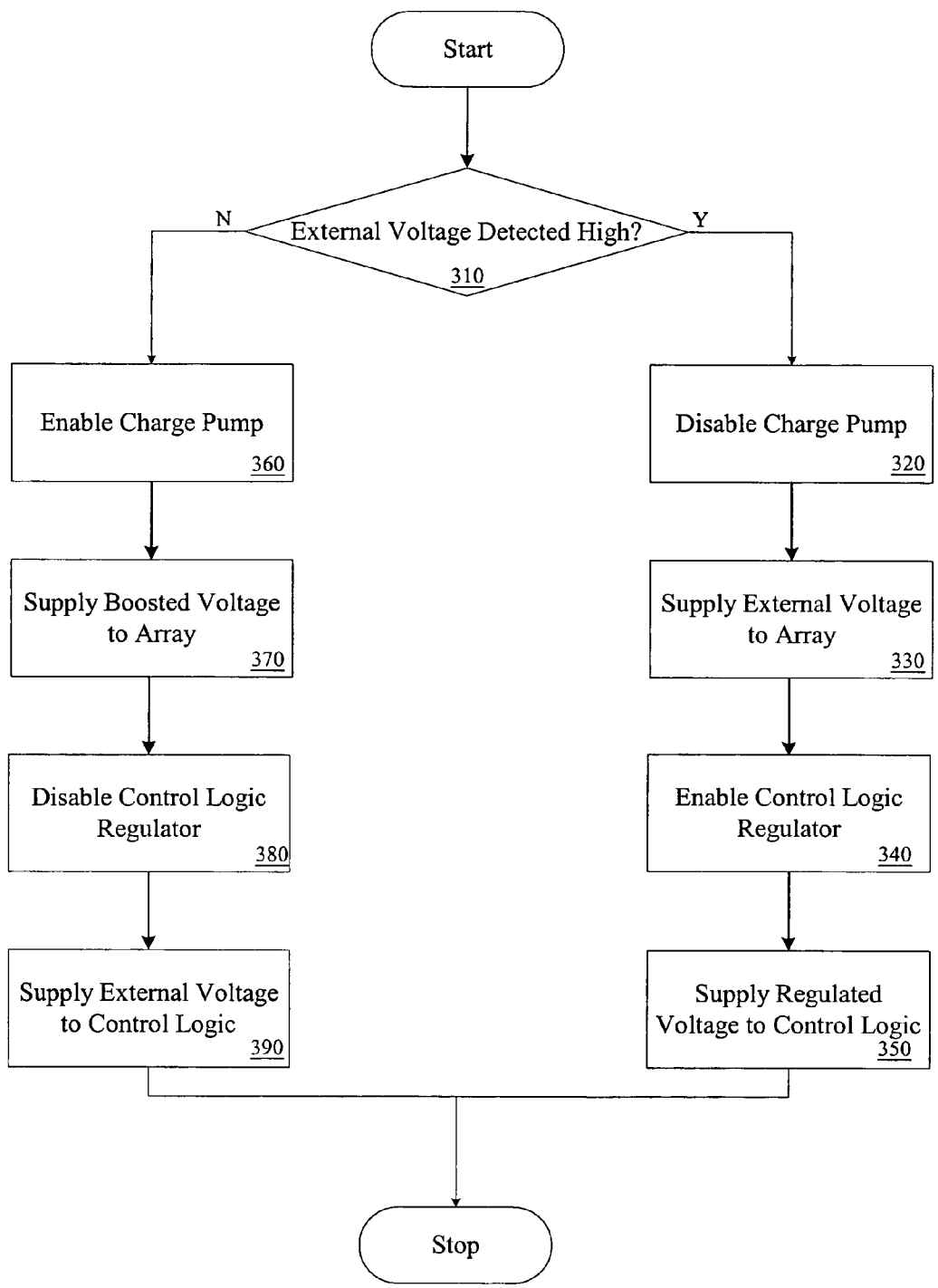
FIG. 3 is a flow diagram illustrating one embodiment of an auto-sense circuit.

FIG. 3 is a flow diagram illustrating one embodiment of an auto-sense circuit. At decision block 310, auto sense circuit 250 determines whether an external voltage suitable to drive memory array 210 has been detected at the external voltage pad. If a voltage is detected that meets the memory array 210 voltage requirements, charge pump circuit 220 is disabled, processing block 320. At processing block 330, the external voltage is supplied to memory array 210. At processing block 340, control logic regulator 230 is enabled. At processing block 350, control logic regulator 230 supplies a standard voltage to control logic 205.

If a suitable array voltage is not detected at auto sense circuit 250, charge pump circuit 220 is enabled at processing block 360. At processing block 370, the boosted voltage from charge pump circuit 220 is supplied to memory array 210. At processing block 380, control logic regulator 230 is disabled. At processing block 390, the external voltage is supplied to control logic 205.

The above-described invention provides a method for reducing system power consumption by bypassing inefficient charge pump circuitry without changing standardized device pin-outs. Thus, power is saved by bypassing the charge pump and leveraging cost savings gained by the high volume manufacturing of standardized packages (like DRAM packages and DIMM PWAs). The reduced power increases system battery/standby time and also saves on package and system cooling requirements. Further, fewer pins are required than in other alternatives using dedicated bypass voltage package pins.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as the invention.

What is claimed is:

1. A system comprising:
   a central processing unit (CPU); and
   a memory device, coupled to the CPU, having:
      a charge pump circuit to amplify a first voltage;
      a voltage detection circuit, coupled to the charge pump circuit, to enable the charge pump circuit if the first voltage is detected and to disable the charge pump circuit if a second voltage is detected; and
      a regulator coupled to the voltage detection circuit, wherein the regulator is enabled whenever the second voltage is detected.

2. The system of claim 1 wherein the regulator is disabled whenever the first voltage is detected.

3. The system of claim 1 wherein the memory device further comprises:
   a memory array coupled to the charge pump circuit and the voltage detection circuit; and
   control logic coupled to the regulator and the memory array.

4. The system of claim 3 wherein the charge pump circuit supplies the amplified first voltage to the memory array whenever the charge pump circuit is enabled.

5. The system of claim 3 wherein the second voltage is supplied to the memory array whenever the charge pump circuit is disabled.

6. The system of claim 3 wherein the first voltage is supplied to the control logic whenever the regulator is disabled.

7. The system of claim 3 wherein a regulated voltage is supplied to the control logic by the regulator whenever the regulator is enabled.

8. The system of claim 3 wherein the memory device further comprises an external voltage pad to receive the first and second voltages.

9. The system of claim 1 wherein the second voltage is greater than the first voltage.

10. The system of claim 1 wherein the memory device is a Dynamic Random Access Memory (DRAM).

11. The system of claim 1 wherein the memory device is a Static Random Access Memory (SRAM).

12. The system of claim 1 wherein the memory device is a Flash Memory.

13. A method comprising:
   receiving a voltage at a memory device from an external source;
   determining whether the received voltage is suitable to power a memory array within the memory device;
   disabling a charge pump circuit if the received voltage is suitable to power the memory array; and
   supplying the external voltage to the memory array.

14. The method of claim 13 further comprising:
   enabling a regulator if the received voltage is suitable to power the memory array; and
   supplying a regulated voltage to control logic within the memory device.

15. The method of claim 13 further comprising:
   enabling the charge pump circuit if the received voltage is not suitable to power the memory array; and
   supplying an amplified voltage to the memory array from the charge pump circuit.

16. The method of claim 15 further comprising:
disabling a regulator if the received voltage is not suitable to power the memory array; and
supplying the received voltage to control logic within the memory device.

17. The method of claim 15 further comprising:
amplifying the received voltage at the charge pump circuit to generate the amplified internal voltage.

18. A memory device comprising:
a memory array;
a charge pump circuit coupled to the memory array to amplify a first voltage; and
a voltage detection circuit, coupled to the charge pump circuit and the memory array, to enable the charge pump circuit if the first voltage is detected and to disable the charge pump circuit if a second voltage is detected; and
a regulator coupled to the voltage detection circuit, wherein the regulator is enabled whenever the second voltage is detected.

19. The memory device of claim 18 further comprising control logic coupled to the regulator.

20. The memory device of claim 18 wherein the voltage detection circuit enables the charge pump circuit if the first voltage is detected at the voltage detection circuit.

21. The memory device of claim 20 wherein the charge pump circuit supplies the amplified first voltage to the memory array whenever the charge pump circuit is enabled.

22. The memory device of claim 20 wherein the second voltage is supplied to the memory array whenever the charge pump circuit is disabled.

23. The memory device of claim 18 wherein the second voltage is greater than the first voltage.

24. The memory device of claim 19 wherein the first voltage is supplied to the control logic whenever the regulator is disabled.

25. The memory device of claim 24 wherein a regulated voltage is supplied to the control logic by the regulator whenever the regulator is enabled.

* * * * *